United States Patent [19]

Nimtz et al.

[11] Patent Number: 5,710,564
[45] Date of Patent: Jan. 20, 1998

[54] SYSTEM FOR ABSORBING ELECTROMAGNETIC WAVES AND METHOD OF MANUFACTURING THIS SYSTEM

[76] Inventors: Günter Nimtz, 34, Starenweg, 50226 Frechen; Achim Enders, 16, Rene-Bohn-Strasse, 51061 Köln, both of Germany

[21] Appl. No.: 569,215

[22] PCT Filed: Jun. 27, 1994

[86] PCT No.: PCT/EP94/02073

§ 371 Date: Dec. 14, 1995

§ 102(e) Date: Dec. 14, 1995

[87] PCT Pub. No.: WO95/00983

PCT Pub. Date: Jan. 5, 1995

[30] Foreign Application Priority Data

Jun. 25, 1993 [DE] Germany ............. 43 21 165.8
Feb. 9, 1994 [DE] Germany ............. 44 04 071.7

[51] Int. Cl.$^6$ ............................................. H01Q 17/00
[52] U.S. Cl. ............................................. 342/1
[58] Field of Search ................... 342/1, 3, 4, 2; 428/409

[56] References Cited

U.S. PATENT DOCUMENTS 5,225,284  7/1993  Tusch ...................... 428/409

FOREIGN PATENT DOCUMENTS 369174  5/1990  European Pat. Off. .
425262  5/1991  European Pat. Off. .
473515  3/1992  European Pat. Off. .

*Primary Examiner*—Daniel T. Pihulic
*Attorney, Agent, or Firm*—Blakely Sokoloff Taylor & Zafman

[57] ABSTRACT

In order to absorb electromagnetic waves in a measurement chamber, the sidewalls and the ceiling of the chamber are lined with contiguous pyramids (20). The pyramid vertices point into the chamber. The structure element (20) has a frame (22) formed by bars made of an electrically insulating glass fiber material and an outer skin (24). The outer skin is cut out of a surface resistance material web. The surface resistance material web is produced by continuously or almost continuously coating a mechanically flexible support web with an electroconductive layer made of a metallic material.

36 Claims, 2 Drawing Sheets

SYSTEM FOR ABSORBING ELECTROMAGNETIC WAVES AND METHOD OF MANUFACTURING THIS SYSTEM

The invention relates to a system for the broad band absorption of electromagnetic waves, whereby a plurality of thin surface resistance layers are arranged three dimensionally in a chamber subjected to the electro-magnetic waves and to methods of manufacturing a system for the broad band absorption of electromagnetic waves.

Such absorption systems are principally used as non-reflective linings of chambers for testing electromagnetic tolerance (EMT).

EP-A 018873 discloses an absorption element for electromagnetic waves which comprises a three dimensional hollow body of rectangular cross-section. The four side walls each have a dielectric substrate and an external surface coating whose specific resistance varies from one end to the other end of the side wall in order to be able to absorb electromagnetic waves with a certain band width.

In another known absorber construction, effective absorption of electromagnetic waves over a predetermined frequency range is supposed to be achieved by increasing the layer thickness and by electromagnetic material parameters designed in dependence on frequency. Such resonance absorbers with large layer thicknesses have a correspondingly large weight and result in relatively high costs and complex static structural features. Their broad band characteristics are not adequate for current EMT test chambers despite the high complexity.

DE-B 1254720 described a system in which a plurality of hollow pyramids are arranged on a wall in abutment with one another. The hollow pyramids are coated on their external and internal surfaces with a conductive lacquer. The conductive lacquer layer is either sprayed directly onto the three dimensional carrier body or produced by dipping the three dimensional body.

In the known systems, either the operational characteristics, for instance the band width and the degree of absorption, are inadequate or the manufacture of the absorption system is complex and expensive.

It is therefore the object of the invention to combine a high degree of absorption efficiency over a large band width with the advantages of manufacturing in a simple manner which may be automated.

This object is solved in accordance with the invention by the features of the apparatus and method claims.

As a result of the invention it is possible for the first time to absorb a broad band spectrum of electromagnetic radiation with the aid of lightweight and thin surface resistance layer components which may be economically manufactured. The invention is based on the recognition that thin surface resistance sheets have an absorptive effect on electromagnetic radiation with differing wave lengths, even with a uniform distribution of the surface resistance, if they are arranged in a chamber subjected to the electromagnetic radiation in a predetermined and/or statistical three dimensional geometry. The broad band characteristics are therefore produced by the particular geometrical arrangement of the thin surface resistance layers in the chamber. Both the powder coated or deposited layer of electrically conductive or semi-conductive layer and also the electrically conductive organic layer make a uniform and constant specific surface resistance distribution possible. The absorption characteristics may be adjusted in a reproducible manner. Since the surface resistance layers are very thin, they advantageously have a low weight and are correspondingly economical to manufacture. The ratio of absorption performance/unit weight of the system is particularly high so that the device in accordance with the invention has an ecological tolerance which has not previously been achieved.

An important aspect of the manufacture of the absorber system in accordance with the invention is that any desired number of absorption elements can be produced from a surface resistance sheet. The carrier sheet or the surface resistance sheet produced after the coating can, for instance, have a breadth of 0.8 m and a length of 10,000 m. The finished surface resistance sheet may be rolled up at the end of the sheet production process into a compact sheet supply. The surface resistance sections required for the geometrical carrier structures are then cut to size, or stamped out or shaped in some other suitable manner from the roll of material, positioned on the carrier structure and secured. The desired spatial, for instance pyramid-shaped absorber structure is thereby produced. The chamber (in the wall and ceiling regions) subjected to the electromagnetic waves is then lined with such absorber pyramids.

An important embodiment of the invention is characterised in that the carrier layer and/or the surface resistance layer is provided with a fire protective layer of electromagnetically inert material, for instance of ceramic, mineral and/or glass-like material.

The surface resistance layer can be a powder coated or deposited metallic or semi-conductor layer. The metallic or semi-conductor materials are preferably selected from the following groups of elements: aluminium, chromium, iron, indium, nickel, antimony, tin, tantalum, titanium and zinc. One or more of these elements are preferably vapour deposited or sputtered onto the carrier sheet, preferably in a vacuum, optionally with the addition of reactive gases, such as oxygen. The vapour deposition method is known per se for the manufacture of aluminium coatings ca.30 nm thick on polymer films for foodstuff packaging and can be used in the context of the invention with corresponding advantages.

A polymer film or paper sheet with a thickness <5 mm, preferably <500 μm, is sufficient as the carrier layer. The thickness of the conductive or semi-conductive layer is 5 nm–1000 nm, preferably 10 nm–100 nm.

In a preferred embodiment the surface resistance layers extend in sections at different angles. This is the case in the wedge-, cone- or pyramid-shaped systems mentioned above. Alternatively, the surface resistance layers can, however, also be arranged, for instance clamped, in a plurality of different planes. The absorption spectrum in the last system referred to above is achieved by the different and preferably parallel absorption planes.

An alternative system, with which principally heavily profiled wall regions can be lined in a broad band absorptive manner, is characterised in a further aspect of the invention in that a three-dimensional absorber structure comprises a receiving container with a filler which is constituted by surface resistance layers in sheet form, preferably bent or creased a number of times. Heavily profiled wall regions can form at least one side wall of the receiving container. Another side wall of the receiving container can be formed by a simple cover which is scarcely mechanically loaded by the creased surface resistance sheets.

In an alternative embodiment the surface resistance layer can be further processed into bulk absorber material. If the surface resistance layer is cut up, e.g. into long, narrow strips, a bulk filler is produced for absorber applications which can exhibit the same absorption performance, with a substantially lower material requirement, as conventional absorber materials which are doped with conductive particles instead of the strips. The arrangement of the narrow strips in the space can be effected not only in ordered structures, e.g. in the manner of a grid, but also statistically distributed, e.g. as in a particulate filler.

The surface resistance layer, e.g. a coated polyethylene film, can also advantageously be further processed by the simple process of thermal shaping and welding. For instance, a thicker absorbent structure may be produced in this manner with chambers and hollow spaces which can be structured in a manner similar to packaging materials of polymer films containing air chambers which were developed for shock-absorbing transport of sensitive products and are known by the name air cushion films.

The positioning and fastening can advantageously be effected particularly simply by pressure differentials, as in an inflatable building, so to speak by "inflating" the absorber, or by means of a framework, similar to that in tent constructions.

Another embodiment of the invention is characterised in that a plurality of air- or gas-filled hollow body structures are closely jointed together and/or connected together with an outer skin constructed as a surface resistance layer and arranged on at least one wall of the chamber. The closed hollow body structures serving as the absorption elements can have different, for instance statistical, surface shapes.

Other advantageous embodiments of the invention are characterised in the dependent claims.

The invention will be described below in more detail with reference to exemplary embodiments which are schematically illustrated in the drawings, in which.

Figure 1:
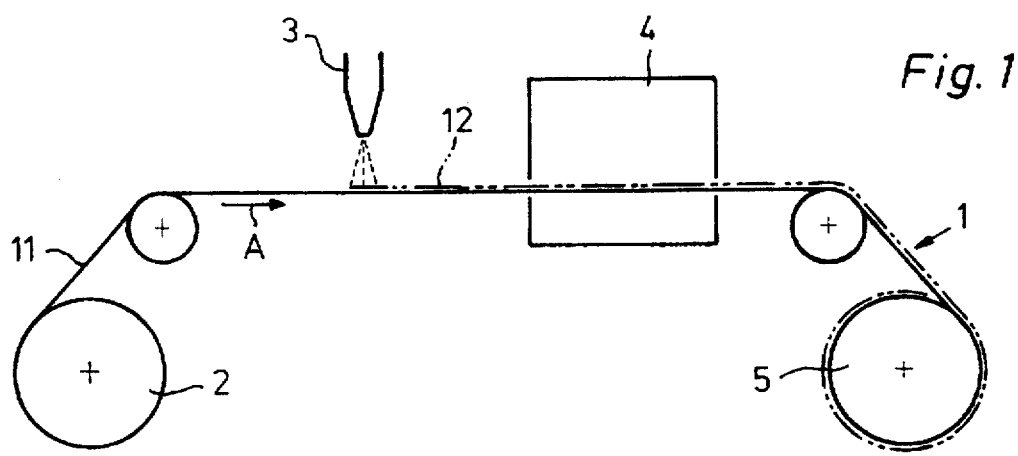
FIG. 1 is a schematic illustration of a station for producing a surface resistance layer from a carrier sheet with a powder coated metal layer.

A particularly economical method of manufacturing the active component of the absorption system in accordance with the invention, namely a surface resistance layer 1, will firstly be described with reference to the illustration of FIG. 1. A thin carrier sheet 11 of polymer film or paper of a thickness of 5–500 μm is withdrawn from a supply roll 2, deflected and moved in the direction of the arrow A into a vapour deposition zone beneath a vapour deposition device 3. Aluminium with oxidative components is applied in the vapour deposition zone in a reactive oxygen atmosphere. An aluminium layer can be vapour coated either in the illustrated manner on one side or on both sides of the carrier sheet 11. In the described exemplary embodiment the Al layer 12 has a thickness of only ca.12–40 nm. A lacquer seal on the resistive layer 12 can be dried in a heating chamber 4. The sheet 1 is thereafter wound up onto a winding roller 5. The value of the surface resistance can be adjusted by variation of the process parameters to a desired value, for instance 150 Ohms.

Figure 2A:
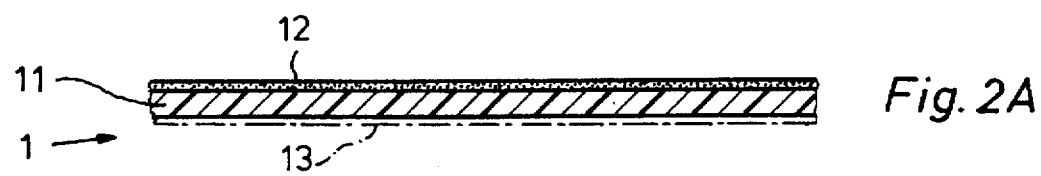
FIG. 2A shows a section on a substantially increased scale of a surface resistance layer produced in accordance with FIG. 1.

An enlarged view of a section of the surface resistance layer 1 is shown in FIG. 2A. As may be seen, the carrier layer 11 can also be covered on both sides with thin, conductive or semi-conductive layers 12 and 13 constituting surface resistances. A double sided coating increases the efficiency of the absorption structure produced from the surface resistance layer 1 since the absorbtivity of the structure on both sides of the layer can be matched to the electromagnetic radiation which is present there. A fire protective layer of a non-inflammable or flame resistant, preferably electrically and electromagnetically substantially inert material, e.g. mineral wool, ceramic material and/or glass, can be provided in addition to or as the layer 13.

As is known to the expert, other coating methods, for instance powder coating (sputtering) or continuous screen or roller printing methods, can be used instead of the described vapour deposition process. A layer comprising, for instance, an organic conductor can also be deposited in this manner.

Figure 2B:
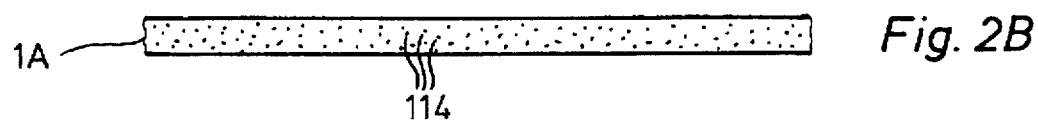
FIG. 2B shows a section, also on an enlarged scale, of a surface resistance layer from an organic conductor.

An alternative embodiment of the surface resistance layer is shown schematically in FIG. 2B. In this alternative embodiment the surface resistance layer 1A comprises a sheet, preferably of plastics material, in which conductive or semi-conductive fine particles 14 are embedded in a distribution which is suitable for absorption purposes. The conductive or semi-conductive particles can also comprise plastics material. Intrinsically conductive polymers, for instance, can be used.

Figure 3A:
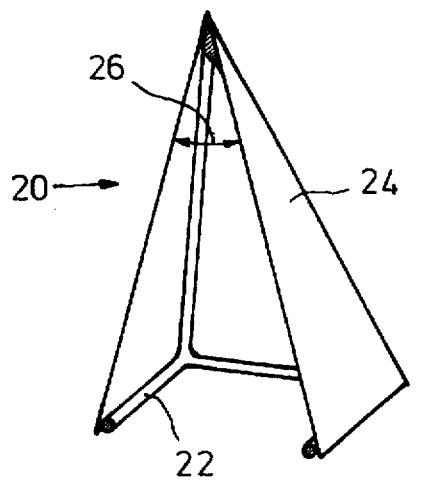
FIG. 3A is a scrap view of an exemplary embodiment of an absorber structure with a pyramidal geometry.

A schematic sectional view through a pyramidal element 20 of the absorption device in accordance with the invention is shown in FIG. 3A. The structural element 20 comprises a rod frame 22 with a square base and four rods of electrically insulating glass fibre material defining the sides of the pyramid and an outer skin 24. The latter is produced from a blank of the sheet material 1 or 1A. In an exemplary embodiment which has been made in practice, a surface resistance layer 1 is placed on the rod frame 22 and fixed in position after suitable cutting to size and thermal welding of the film constituting the carrier sheet 11. The pyramid constituting the absorption element 20 had a height of 1.50 mm and an open base surface of 0.35×0.35 m². As may easily be seen, numerous geometrical structures may be simply made up from a suitable support frame and surface resistance blanks. The apex should be relatively pointed with conical, wedge or pyramid-shaped structures and elements and have an apex angle 26 in the range between 5° and 50°, preferably between 8° and 25°.

Figure 3B:
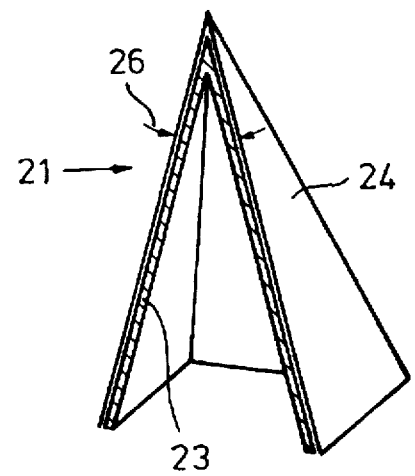
FIG. 3B shows an absorber structure similar to that of FIG. 3A with a carrier structure of different construction.

FIG. 3B shows a similar absorption element 21 to that (20) of FIG. 3A. The single difference is that the outer skin 24 of the pyramid is not supported by a carrier frame 22 but is laminated onto a pyramidal, self-supporting hollow body 23 of a suitable plastics material or of cardboard. The outer skin 24 can, however, also be constructed as an inflatable component in the manner of an inflatable building in a constructional alternative which is not shown in the drawing. The skin 24 constituting the absorption structure is subjected to a small pressure differential which holds the outer skin 24 in its pyramidal geometry.

Instead of the pyramidal shape illustrated in FIGS. 3A and 3B, a combined cone-pyramid frustum shape can also be provided. The tip situated closest to the apex is conical and the base plane is of square shape in order to cover a larger absorption surface with corresponding structural elements, without spaces or only with minimal spaces.

Figure 4:
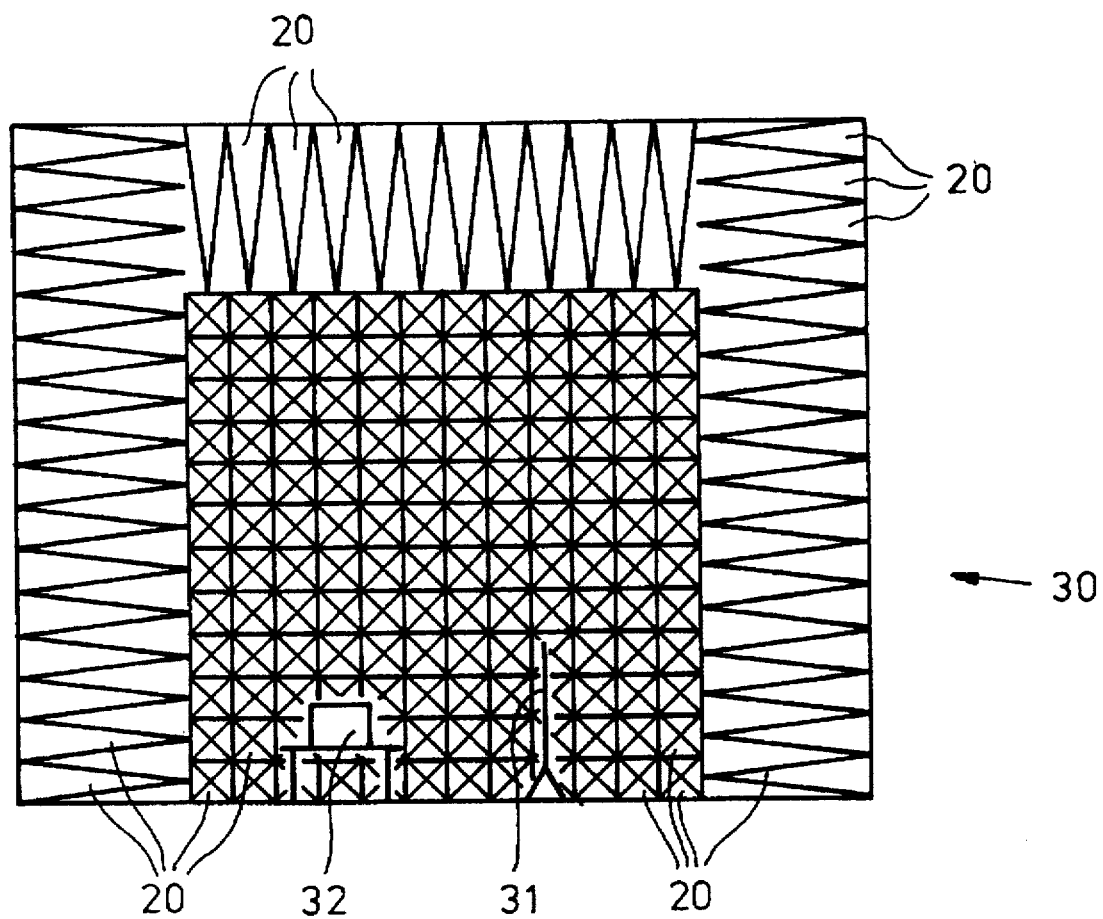
FIG. 4 is a schematic side view of the interior of a chamber subjected to electromagnetic waves, the side and top walls of which are virtually completely covered with pyramidal absorber structures.

A vertical section through an EMT test chamber, whose side wall and ceiling are lined practically gaplessly in with pyramidal, abutting absorber structures 20 is shown schematically in FIG. 4. An antenna arrangement 31 and the device 32 to be tested are shown in the test chamber 30. As may be seen, the lining of the test chamber 30 with geometrically distributed surface resistances ensures a virtually total, non-reflective absorption of the field energy so that optimum test results are ensured.

Numerous modifications are possible within the scope of the inventive concept. The selection of the materials of the carrier and surface resistances and the geometrical dimensions of the sheets and structures can be matched to the conditions of use. Transparent surface resistance layers are produced, for instance, by the use of indium-tin-oxide.

We claim:

1. A system for the broad band absorption of electromagnetic waves, wherein a plurality of thin surface resistance layers are arranged in a three-dimensional configuration, each of said surface resistance layers comprising
    a) a first layer of a mechanically flexible sheet material having a layer thickness less than 5 mm;
    b) at least one second layer composed of a material selected from a group of materials consisting of an electrically conductive material and a semiconductive material,
    said at least one second layer being applied to said first layer, said first layer forming a carrier layer for said second layer,
    said second layer having a thickness in the range from 5 nm to 1,000 nm and having a uniform and constant surface resistance distribution, said second layer being substantially continuously manufactured by a process selected from the group of powder coating and deposition processes.

2. The system as claimed in claim 1, wherein the surface resistance layers are constituted by electrically conductive particles on a sheet material selected from a group of materials consisting of plastic sheet material and paper sheet material.

3. The system as claimed in claim 1, wherein the surface resistance layers are constituted by electrically conductive particles in a sheet material selected from a group of materials consisting of plastic sheet material and paper sheet material.

4. The system as claimed in claim 1, wherein the surface resistance layers are constituted by electrically conductive particles on and in a sheet material selected from a group of materials consisting of plastic sheet material and paper sheet material.

5. The system as claimed in claim 1, wherein each of said surface resistance layers has a surface resistance value in a range from 0.01 Ohm per square to 20 kOhm per square.

6. The system as claimed in claim 1, wherein the surface resistance layer includes a carrier layer of a material selected from a group of materials consisting of polymer film and paper having a thickness in the range of 5–5000 μm.

7. The system as claimed in claim 1, wherein the surface resistance layer includes an at least weakly conductive layer of a material selected from a group of materials consisting of a pure metal, a metal alloy and a semiconductor said selected material comprising at least one of the elements Al, Cr, Fe, In, Ni, Sb, Sn, Ta, Ti and Zn.

8. The system as claimed in claim 7, wherein said at least weakly conductive layer has a thickness in the range of 10 nm to 200 nm.

9. The system as claimed in claim 1, wherein at least one of said surface resistance and carrier layers is provided with at least one closed fire protective layer of a flame-resistant material.

10. The system as claimed in claim 9, wherein the first protective layer comprises a material selected from a group of materials consisting of an electrically and an electromagnetically substantially inert material.

11. The system of claim 10, wherein said substantially inert material consists of at least one of the materials mineral, ceramic material and glass.

12. The system as claimed in claim 1, characterized in that the surface resistance layers are disposed in a plurality of different planes.

13. The system as claimed in claim 1, wherein the surface resistance layers are applied to at least one carrier member said carrier member having a shape selected from a group of carriers consisting of wedge, cone, pyramid and step shapes.

14. The system as claimed in claim 13, wherein the carrier is formed as a hollow body having substantially rigid side surfaces said side surfaces being covered with sections of said surface resistance layer said sections being cut fittingly to size.

15. The system as claimed in claim 13, wherein the carrier comprises a carrier frame which has a struts disposed at least at transition edges between two adjacent planes of surface resistance layers, for instance between two side surfaces of a pyramid.

16. The system as claimed in claim 15, wherein the surface resistance layers comprise a flexible sheet material said flexible sheet material covering outer surfaces of the carrier.

17. The system as claimed in claim 12, wherein a plurality of sheets are provided with surface resistance layers and are secured in at least partially overlapping relationship in spaced, substantially parallel planes.

18. The system as claimed in claim 1, wherein said system comprises a three-dimensional absorber structure comprising a container for receiving a filler which is constituted by surface resistance layers of sheet material, bent a number of times to form a plurality of surface resistance layer sections.

19. The system as claimed in claim 18, wherein said surface resistance layer sections of sheet material are disposed in an arbitrary arrangement in a hollow chamber formed in said receiving container.

20. The system as claimed in claim 1, wherein said three dimensional configuration is composed of a plurality of three dimensional absorber elements, which substantially completely cover all side walls and top walls of a chamber to be subjected to electromagnetic waves.

21. The system as claimed in claim 13, wherein said at least one carrier and surface resistance is formed as an absorber pyramid having an acute apex angle in the range between 8° to 250°.

22. A system for the broad band absorption of electromagnetic waves, wherein a plurality of mechanically flexible surface resistance layers are arranged in a three-dimensional configuration, each of said surface resistance layers being formed from a single carrier layer comprising an organic conductor which has a uniform and constant surface resistance distribution, said surface resistance layer being substantially continuously manufactured with a layer thickness less than 5 mm.

23. The system as claimed in claim 22, wherein the surface resistance layers are constituted by electrically conductive particles on a sheet material selected from a group of materials consisting of plastic sheet material and paper sheet material.

24. The system as claimed in claim 22, wherein each of said surface resistance layers has a surface resistance value in a range from 0.01 Ohm per square to 20 kOhm per square.

25. The system as claimed in claim 22, wherein the surface resistance layer includes an at least weakly conductive layer of a material selected from a group of materials consisting of a pure metal, a metal alloy and a semiconductor said selected material comprising at least one of the elements Al, Cr, Fe, In, Ni, Sb, Sn, Ta, Ti and Zn.

26. The system as claimed in claim 25, wherein said at least weakly conductive layer has a thickness in the range from 10 nm to 200 nm.

27. A method of manufacturing a system for the broad band absorption of electromagnetic waves, said method comprising the steps of:

a) providing a web of a mechanically flexible sheet material said sheet material having a thickness of less than 5 mm;

b) coating said web of mechanically flexible sheet material with an at least weakly conductive material in a substantially continuous process so as to form at least one surface resistance layer at a thickness in the range from 5 nm to 1,000 mm, said at least one surface resistance layer having a substantial uniform and constant surface resistance distribution, thereby obtaining a web of a surface resistance sheet material;

c) forming a plurality of surface resistance sections from said web of surface resistance sheet material;

d) providing three-dimensional structures adapted to define geometrical bodies, said bodies having three dimensional shapes selected from the group of shapes consisting of pyramid-, wedge-, cone-, and step-shapes; and e) covering said three dimensional structures with said surface resistance sections formed in step c) to form absorber elements shaped as defined by said three-dimensional structures.

28. The method as claimed in claim 27, wherein said surface resistance sections are formed into shapes selected from the group of shapes consisting of pyramid-, wedge-, cone-, and step-shapes; positioning said shaped surface resistance sections in a chamber to be subjected to an electromagnetic radiation and subjecting said shapes to pressure gradient so as to maintain the three-dimensional shapes thereof.

29. The method defined in claim 27, wherein the coating step b) is accomplished by a substantially continuous deposition of an electrically conductive material from the vapor phase in an atmosphere selected from a group of atmospheres consisting of a vacuum and a vacuum with the addition of at least one reactive gas.

30. The method as defined in claim 27, wherein said coating step b) comprises a powder coating of an electrically conductive material in an atmosphere selected from a group of atmospheres consisting of a vacuum and a vacuum with the addition of at least one reactive gas.

31. The method as defined in claim 27, wherein said conductive material is selected from a group of materials consisting of pure metal, metal alloy and a semiconductor including at least one of the elements Al, Fe, In, Ni, Sb, Sn, Ta, Ti and Zn.

32. A method of manufacturing a system for the broad band absorption of electromagnetic waves, said method comprising the steps of a) providing a web of a mechanically flexible sheet material said sheet material having a thickness of less than 5 mm;

b) coating said web of mechanically flexible sheet material with an at least weakly conductive material in substantially continuous process so as to form at least one surface resistance layer at a thickness in the range from 5 nm to 1,000 nm, said at least one surface resistance layer having a substantially uniform and constant surface resistance distribution, thereby obtaining a web of a surface resistance sheet material;

c) forming a plurality of surface resistance sections form said web of surface resistance sheet material;

d) arranging a plurality of two-dimensional surface resistance sections in a mutually spaced and substantially parallel relationship.

33. The method defined in claim 32, wherein the coating step b) is accomplished by a substantially continuous deposition of an electrically conductive material from the vapor phase in an atmosphere selected from a group of atmospheres consisting of a vacuum and a vacuum with the addition of at least one reactive gas.

34. The method as defined in claim 32, wherein said coating step b) comprises a powder coating of an electrically conductive material in an atmosphere selected from a group of atmospheres consisting of a vacuum and a vacuum with the addition of at least one reactive gas.

35. The method as defined in claim 32, wherein said conductive material is selected from a group of materials consisting of pure metal, metal alloy and a semiconductor including at least one of the elements Al, Fe, In, Ni, Sb Sn, Ta, Ti and Zn.

36. The system as claimed in claim 5, wherein each of said surface resistance layers has a surface resistance value in a range 100 Ohm per square to 1 kOhm per square.

* * * * *

UNITED STATES PATENT AND TRADEMARK OFFICE
CERTIFICATE OF CORRECTION

PATENT NO. : 5,710,564
DATED : January 20, 1998
INVENTOR(S) : Nimtz et al.

It is certified that error appears in the above-identified patent and that said Letters Patent is hereby corrected as shown below:

In the title page, item [76] Inventors, please delete " Rene-Bohn-Strasse " and insert -- Rene-Bohn Straβe --.

In column 4 at line 65, please delete " in ".

Signed and Sealed this

Twenty-seventh Day of October, 1998

Attest:

BRUCE LEHMAN

*Attesting Officer*       *Commissioner of Patents and Trademarks*